(12) United States Patent
Busser (10) Patent No.: US 10,948,547 B2
(45) Date of Patent: Mar. 16, 2021

(54) BATTERY MONITORING SYSTEM (71) Applicant: LG Chem, Ltd., Seoul (KR)

(72) Inventor: Robert Dale Busser, West Bloomfield, MI (US)

(73) Assignee: LG Chem, Ltd., Seoul (KR)

( * ) Notice: Subject to any disclaimer, the term of this patent is extended or adjusted under 35 U.S.C. 154(b) by 294 days.

(21) Appl. No.: 16/198,955

(22) Filed: Nov. 23, 2018

(65) Prior Publication Data

US 2020/0166579 A1 May 28, 2020

(51) Int. Cl.
*G01R 31/389* (2019.01)
*G01R 31/36* (2020.01)

(52) U.S. Cl.
CPC ....... *G01R 31/389* (2019.01); *G01R 31/3648* (2013.01)

(58) Field of Classification Search
CPC . G01R 31/396; G01R 31/3648; G01R 31/389
USPC .......................................................... 702/63
See application file for complete search history.

(56) References Cited

U.S. PATENT DOCUMENTS

| | | | |
|---|---|---|---|
| 6,805,987 B2 | 10/2004 | Bai et al. | |
| 7,616,003 B2 | 11/2009 | Satoh et al. | |
| 9,634,361 B2 | 4/2017 | Fink | |
| 2003/0206021 A1* | 11/2003 | Laletin | G01R 31/386 324/426 |
| 2011/0204898 A1* | 8/2011 | Kim | G01R 19/2506 324/434 |
| 2012/0004875 A1* | 1/2012 | Maeda | H01M 10/48 702/63 |
| 2012/0242344 A1* | 9/2012 | Ishishita | B60L 3/0046 324/430 |
| 2013/0080096 A1* | 3/2013 | Toki | G01R 31/389 702/63 |
| 2013/0138370 A1 | 5/2013 | Oh et al. | |
| 2014/0266228 A1* | 9/2014 | Baruzzi | G01R 31/3648 324/430 |

(Continued)

FOREIGN PATENT DOCUMENTS

| | | |
|---|---|---|
| CN | 101639523 A | 2/2010 |
| CN | 105954592 B | 8/2017 |

(Continued)

*Primary Examiner* — Ricky Ngon
*Assistant Examiner* — Ricky Go
(74) *Attorney, Agent, or Firm* — Buckert Patent & Trademark Law Firm PC; John F. Buckert (57) ABSTRACT

A battery monitoring system includes a current sensor and a voltage sensor coupled to a battery cell. It also includes a microcontroller that opportunistically computes many estimates of the cell's ohmic resistance and filters these estimates to arrive at a stable value. Each estimate is traditionally computed from a delta change in voltage divided by delta change in current measured before and after a significant change in current magnitude. An improvement in accuracy of each resistance estimate is achieved by only computing an estimate if the rate of change of voltage and the rate of change of current exhibited by the values making up the delta voltage and delta current are tightly consistent and of the same polarity. This approach significantly minimizes errors induced in estimates not preselected in this manner by the different and also asynchronous sample rates of the cell's voltage and current.

9 Claims, 6 Drawing Sheets

(56) References Cited

U.S. PATENT DOCUMENTS

2017/0131359 A1\* 5/2017 Kizler .................. G01R 31/367
2018/0031641 A1\* 2/2018 Drees .................. H01M 10/486

FOREIGN PATENT DOCUMENTS

| JP | 4043977 B2 | 2/2008 |
| JP | 2010286445 A | 12/2010 |
| JP | 2011047820 A | 3/2011 |
| JP | 2013246088 A | 12/2013 |
| KR | 101863036 B1 | 6/2018 |

\* cited by examiner

BATTERY MONITORING SYSTEM

BACKGROUND

Figure 2:
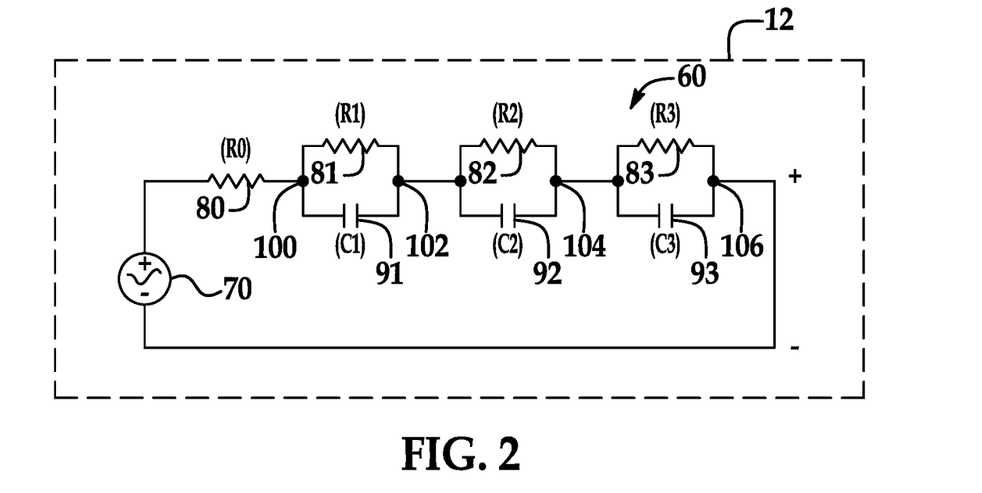
FIG. 2 is a schematic of a battery cell equivalent circuit model associated with the battery cell of FIG. 1.

Referring to FIG. 2, an equivalent circuit model 60 used in representing an electrical response of a battery cell 12 to a flowing current is illustrated. One of the main elements of the equivalent circuit model 60 is the DC resistance value R0 (also referred to as an "ohmic resistance value" herein) of the resistor 80. Pursuant to Ohm's Law, the voltage drop across the resistor 80 is a function of current through the resistor 80 times the resistance value of the resistor 80. This voltage drop, and associated $i^2R$ power loss, is power that is unavailable to the intended application of the battery call 70. At the beginning of life of the battery cell, the ohmic resistance value R0 is at a respective lowest value. However, aging of the battery cell, due to calendar age and current throughput, results in a growing value of R0. Thus, one of the tasks of a microcontroller is to continuously monitor/estimate the growing value of R0 because of its major impact on the ability of the system to deliver power.

Estimation of R0 is based on Ohm's Law $V_{voltage} = I_{current} * R_{resistance}$.

Figure 3:
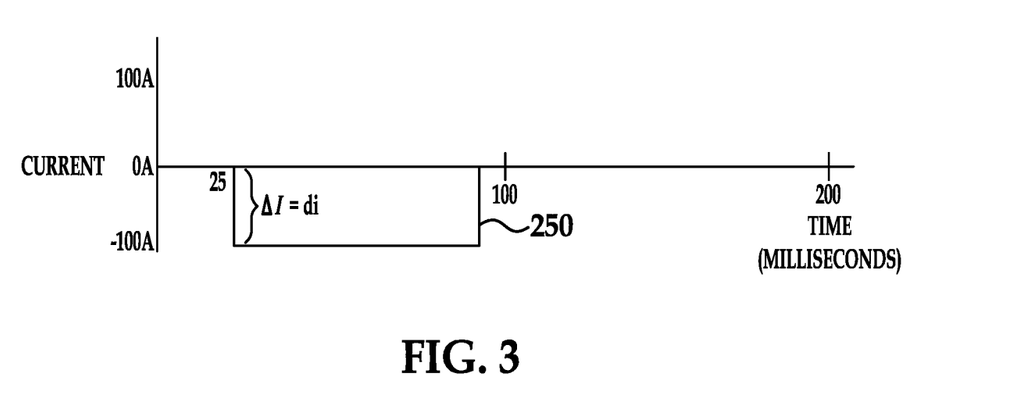
FIG. 3 is a graph of an exemplary current curve associated with the battery cell of FIG. 1 while discharging the battery cell.
Figure 4:
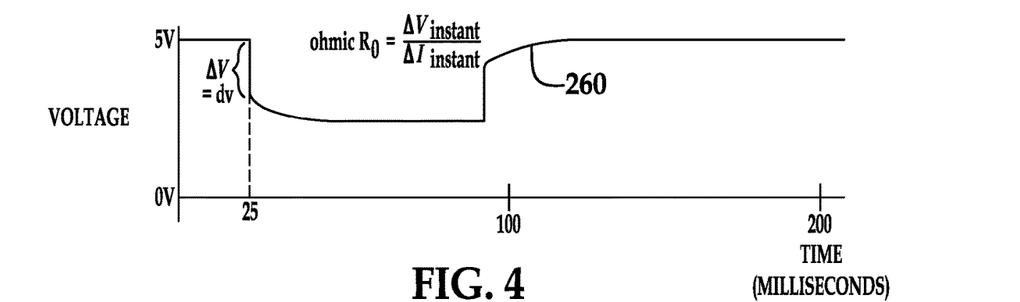
FIG. 4 is a graph of an exemplary voltage curve associated with the battery cell of FIG. 1 while discharging the battery cell.

Referring to FIGS. 3 and 4, an exemplary current curve 250 and an exemplary voltage curve 260 are illustrated. With a value of 0 amps current at times t=0 (e.g., time=0-25 milliseconds in FIGS. 3 and 4), a voltage drop across resistor 80 is 0 volts so the Open Circuit Voltage at the +/−terminals is effectively the same as that of the battery cell itself. An instantaneous change in current at t=25 milliseconds, due to the connection of a load at the battery cell terminals at t=1 (e.g., time t=25 milliseconds in FIGS. 3 and 4), will cause the voltage at the terminals to drop by the value=>$I_{current} * R_{resistance}$. This value can be determined by the difference between the Open Circuit Voltage (OCV)= $V_{t=0}$ and the new voltage at the terminals $V_{t=1}$.

Knowing these values, the voltage drop across resistor 80 is equal to $(V_{t=1} - V_{t=0})$ or $\Delta V$ and the value of current through resistor 80 or $I_{t=1}$ then R0 can be determined as $R0 = \Delta V / I_{t=1}$.

More generally, at any time t, $R0 = \Delta V / \Delta I$ where $\Delta V = V_{t=(i)} - V_{t=(i-1)}$ $\Delta I = I_{t=(i)} - I_{t=(i-1)}$; and $i \geq 1$ This form of Ohm's Law expression is a mathematically correct relationship. However, there are practical limitations to applying this in a real time embedded software system. The expression $R0 = \Delta V / \Delta I$ is only ideally true for instantaneous measurements of cell voltage immediately following changes in current.

At any amount of time $\Delta t > 0$ (after the change in the value of current I), the dynamic aspects of the Equivalent Circuit Model (R1, R2, R3, C1, C2, C3) also impact the relationship between the current I and the cell voltage measured at the terminals.

If $\Delta t$ is significant, then the relationship $R0 = \Delta V / \Delta I$ is no longer valid.

The practical difficulty in computing $R0 = V_{t=(i)} - V_{t=(i-1)} / I_{t=(i)} - I_{t=(i-1)}$, where the time $\Delta t$ between the acquisition of the value $V_{t=(i-1)}$ after the acquisition of the value $I_{t=(i-1)}$ and also the time $\Delta t$ between the acquisition of the value $V_{t=(i)}$ after the acquisition of the value $I_{t=(i)}$ are both at near 0 values, is the fact that the hardware and software processes involved all take non-zero amounts of time. These actual analog values of voltage and current must be acquired by the hardware, converted from analog to digital form in the hardware, the digital form of these values must be input into the computer software's domain, then these values are passed to the software processes that compute the R0 estimates.

In addition to the non-zero amount of time involved in these steps, the steps themselves are often executed at different frequencies. The collection of values of current may take place at one rate, such as 200 times per second (200 Hz). The collection of values of cell voltages may take place at a different rate, such as 10 Hz. Finally, the computation of estimations of R0 values make take place at yet another rate—for example 5 Hz.

In addition to these current and cell voltage timing synchronization issues, each of the signal's values include error components due to inherent electrical noise in the hardware sensors that are used to acquire samples of current and cell voltage for each cell.

A battery monitoring system needs to have an accurate understanding of the R0 ohmic resistance values of each battery cell in a battery pack. The inventor herein has recognized that in order to gain this knowledge, a battery monitoring system will frequently compute estimates of the R0 values of each battery cell and smooth the results of these estimates using a smoothing filter or slew rate limiter in order to diminish or cancel out the effects of the various types of noise-related errors in these estimates—with the assumption that the errors are basically Gaussian in nature (e.g., as likely to be inaccurately over estimating as inaccurately underestimating the R0 values). Further, the inventor has conceived a battery monitoring system that identifies and selects good candidate current and cell voltage pairs for use in R0 estimate calculations, and filtering out current and cell voltage pairs that have identifiable synchronization and electrical-noise related errors, to obtain a filtered ohmic resistance value.

SUMMARY

A battery monitoring system in accordance with an exemplary embodiment is provided. The battery monitoring system includes a current sensor electrically coupled in series with a battery cell. The battery monitoring system further includes a voltage sensor electrically coupled in parallel to the battery cell. The battery monitoring system further includes a microcontroller obtaining cell current values of a cell current flowing through the battery cell from the current sensor at a first update frequency of M times per second. The microcontroller obtains cell voltage values of the battery cell from the voltage sensor, in parallel to the obtaining of the cell current values, with respect to electrical ground, at a second update frequency of N times per second, wherein $M \geq N$. At a third update frequency of R times per second, where $R < M$ and $R < N$, the microcontroller determines a rate of change of cell current utilizing two cell current values of the cell current values. Further, at the third update frequency, the microcontroller determines a rate of change of cell voltage utilizing two cell voltage values of the cell voltage values. Further, at the third update frequency, the microcontroller determines a filtered ohmic resistance value based on the rate of change of cell voltage, the rate of change of cell current, and a prior filtered ohmic resistance value, if a numerical sign of the rate of change of cell voltage being identical to a numerical sign of the rate of change of cell current, and the rate of change of cell voltage being less than or equal to an upper threshold of allowable rates of cell voltage change, and the rate of change of cell voltage being greater than or equal to a lower threshold of allowable rates of cell voltage change.

DETAILED DESCRIPTION

Figure 1:
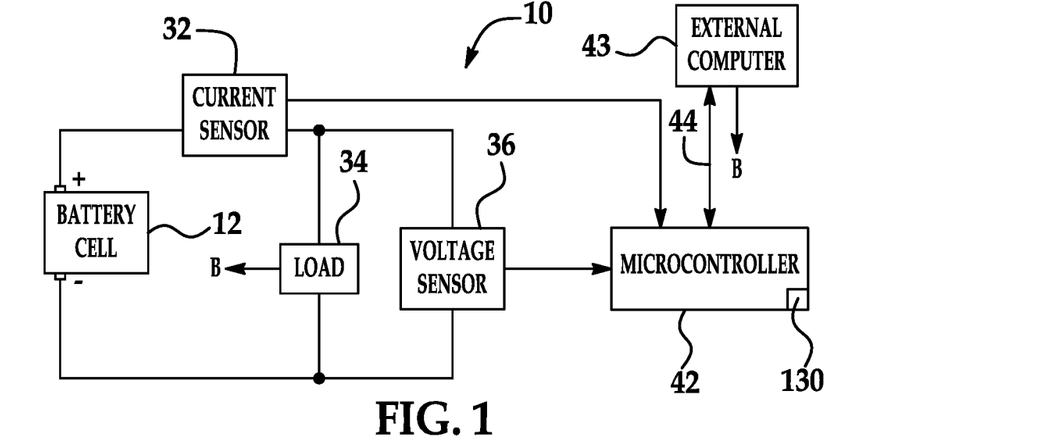
FIG. 1 is a schematic of a battery monitoring system for a battery cell in accordance with an exemplary embodiment.

Referring to FIG. 1, a battery monitoring system 10 for monitoring a battery cell 12 in accordance with an exemplary embodiment is provided. The system 10 includes a battery cell 12, a current sensor 32, an electrical load 34, a voltage sensor 36, a microcontroller 42, and an external computer 43. An advantage of the battery monitoring system 10 is that the system 10 identifies and selects good candidate current and cell voltage pairs for use in R0 estimate calculations, and filters out current and cell voltage pairs that have identifiable time synchronization and electrical-noise related errors, to obtain a filtered ohmic resistance value of the battery cell 12.

Referring to FIGS. 1 and 2, the battery cell 12 includes a positive terminal (+) and a negative terminal (−). In an exemplary embodiment, the battery cell 12 is a pouch-type lithium-ion battery cell. Of course, in an alternative embodiment, other types of battery cells could be utilized. The battery cell 12 is mathematically modeled utilizing the battery cell equivalent circuit model 60 having a voltage source 70, resistors 80, 81, 82, 83, capacitors 91, 92, 93, and electrical nodes 100, 102, 104, 106.

The resistor 80 is coupled between the voltage source 70 and the electrical node 100. The resistor 81 and the capacitor 91 are electrically coupled parallel to one another between the electrical nodes 100, 102. The resistor 82 and the capacitor 92 are electrically coupled parallel to one another between the electrical nodes 102, 104. The resistor 83 and the capacitor 93 are electrically coupled parallel to one another between the electrical nodes 104, 106. The electrical node 106 is further coupled to the voltage source 70.

The resistor 80 has a resistance value R0 corresponding to an internal ohmic resistance value of the battery cell 12. The resistor 81 has a resistance value R1 corresponding to a first time-varying resistance value of the battery cell 12. The resistor 82 has a resistance value R2 corresponding to a second time-varying resistance value of the battery cell 12. The resistor 83 has a resistance value R3 corresponding to a third time-varying resistance value of the battery cell 12. The capacitor 91 has a capacitance value C1 corresponding to a first time-varying capacitance of the battery cell 12. The capacitor 92 has a capacitance value C2 corresponding to a second time-varying capacitance of the battery cell 12. The capacitor 93 has a capacitance value C3 corresponding to a third time-varying capacitance of the battery cell 12. The total steady state resistance of the battery cell equivalent circuit model 60 is R0+R1+R2+R3.

Referring to FIG. 1, the current sensor 32 is electrically coupled in series between the positive terminal of the battery cell 12 and the electrical load 34. The current sensor 32 outputs current values each indicating a current level (e.g., a magnitude of current) flowing through the battery cell 32, which is received by the microcontroller 42.

The electrical load 34 is electrically coupled between the current sensor 32 and the negative terminal of the battery cell 12. In an exemplary embodiment, the electrical load is an electric motor in which the operation (e.g., speed, torque etc.) of the electric motor is controlled by the external computer 43.

The voltage sensor 36 is electrically coupled in parallel with the electrical load 34. The voltage sensor 36 outputs voltage values each indicating a voltage (e.g., a magnitude of voltage) across the battery cell 12, which is received by the microcontroller 42.

The microcontroller 42 is electrically coupled to the current sensor 32 and the voltage sensor 36. The microcontroller 42 operably communicates with the external computer 43 via a communication bus 44. The microcontroller 42 includes a memory device 130 for storing data, tables, and software instructions for implementing at least a portion of the methods described hereinafter.

A brief explanation of the underlying methodology for determining whether a pair of current values and a pair of voltage values are acceptable timewise for accurately determining an ohmic resistance value R0 will now be provided.

Figure 5:
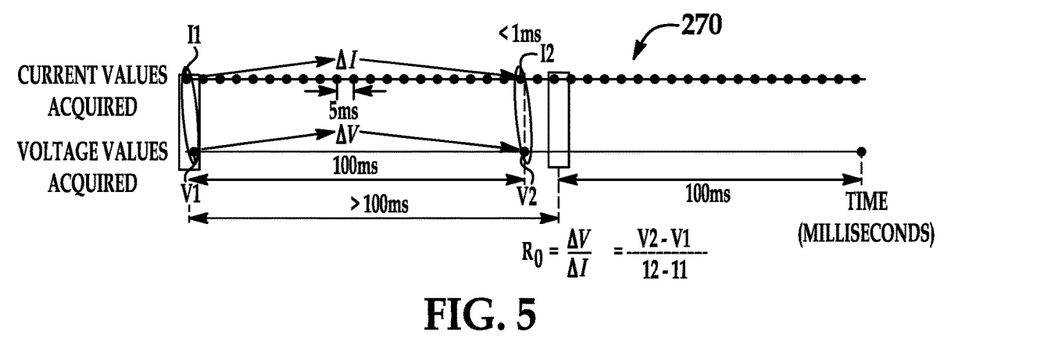
FIG. 5 is a graph of current values obtained at a first update frequency, and voltage values obtained at a second update frequency, and an ohmic resistance value calculation determined at a third update frequency, in which a first pair of current values I1, I2 and first pair of voltage values V1, V2 are valid values for an ohmic resistance value calculation.

Referring to FIG. 5, a graph 270 of a valid pair of current values and a valid pair of voltage values for determining an accurate ohmic resistance value R0 is shown. In particular, the graph 270 has a plurality of current values that are obtained at a first update frequency (e.g., a current value obtained every 5 milliseconds), and a plurality of voltage values that are obtained at a second update frequency (e.g., a voltage value obtained every 100 milliseconds). Further, an ohmic resistance value calculation for R0 is performed at a third update frequency (e.g., an ohmic resistance value calculation obtained at greater than every 100 milliseconds). The current value I1 precedes the voltage value V1 by a relatively small amount of time, and the current value I2 precedes the voltage value V2 by a relatively small amount of time, such that the current values I1, I2 and the voltage values V1, V2 are valid values timing wise for an ohmic resistance value calculation for R0.

Figure 6:
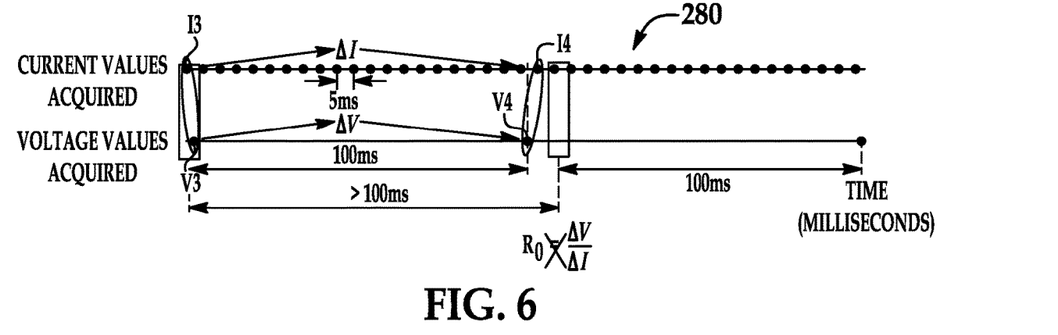
FIG. 6 is a graph of current values obtained at a first update frequency, and voltage values obtained at a second update frequency, in which a first pair of current values I3, I4 and first pair of voltage values V3, V4 are not valid values timewise for the ohmic resistance value calculation.

Referring to FIG. 6, a graph 280 of an invalid valid pair of current values and an invalid pair of voltage values that would not result in an accurate ohmic resistance value R0 is shown. In particular, the graph 280 has a plurality of current values that are obtained at a first update frequency (e.g., a current value obtained every 5 milliseconds), and a plurality of voltage values that are obtained at a second update frequency (e.g., a voltage value obtained every 100 milliseconds). The current value I3 precedes the voltage value V3 by a relatively small amount of time which is acceptable. However, the current value I4 is obtained after the voltage value V4 which would not result in an accurate ohmic resistance value R0 being calculated based on I3, I4, V3, V4.

Figure 7:
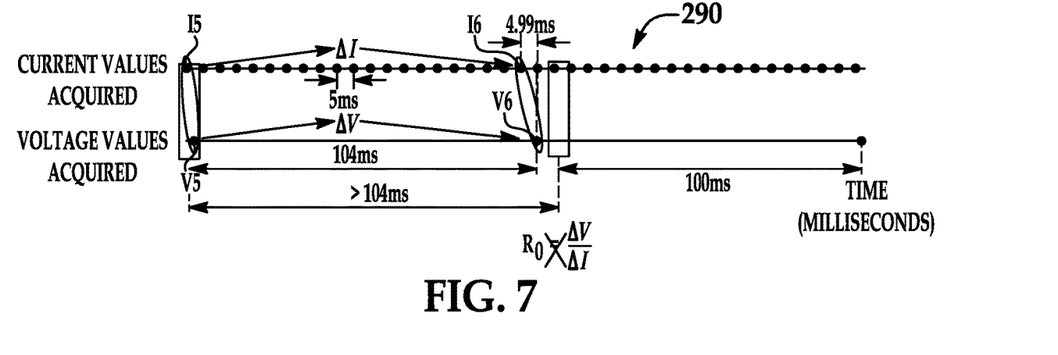
FIG. 7 is a graph of current values obtained at a first update frequency, and voltage values obtained at a second update frequency, in which a first pair of current values I5, I6 and first pair of voltage values V5, V6 are not valid values timewise for the ohmic resistance value calculation.

Referring to FIG. 7, a graph 290 of an invalid valid pair of current values and an invalid pair of voltage values that would not result in an accurate ohmic resistance value R0 is shown. In particular, the graph 290 has a plurality of current values that are obtained at a first update frequency (e.g., a current value obtained every 5 milliseconds), and a plurality of voltage values that are obtained at a second update frequency (e.g., a voltage value obtained every 100 milliseconds). The current value I5 precedes the voltage value V5 by a relatively small amount of time which is acceptable. However, the current value I6 is obtained a relatively large amount of time (e.g., 4.99 milliseconds) before the voltage value V6 which would not result in an accurate ohmic resistance value R0 being calculated based on I5, I6, V5, V6.

Referring to FIGS. 1 and 8-11, a flowchart of a method for determining a filtered ohmic resistance value of a battery cell 12 will now be explained.

Figure 8:
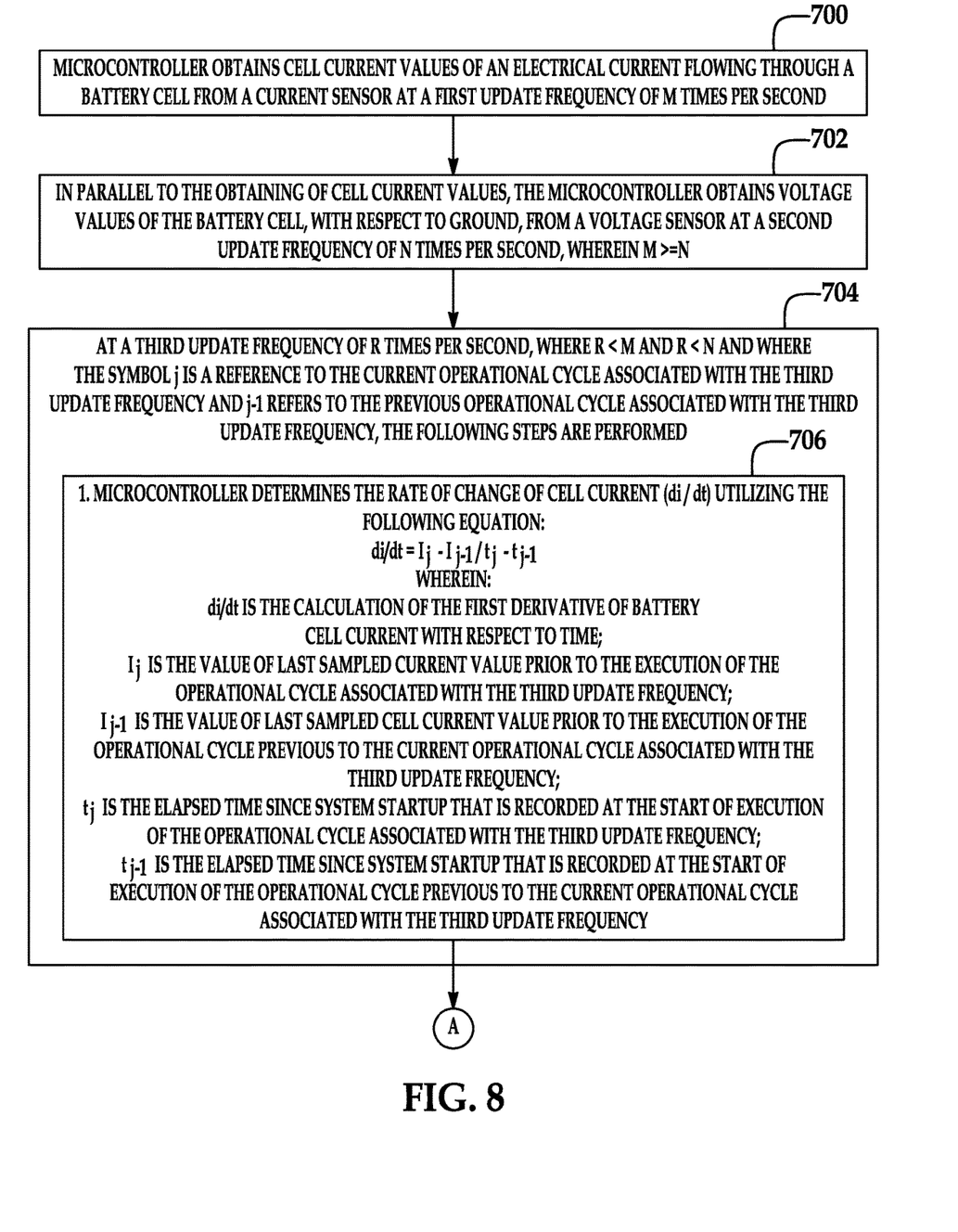
FIGS. 8-11 are flowcharts of a method for determining a filtered ohmic resistance value associated with a battery cell.

At block 700, the microcontroller 42 obtains cell current values of an electrical current flowing through the battery cell 12 from the current sensor 32 at a first update frequency of M times per second.

At block 702, in parallel timewise to the obtaining of cell current values, the microcontroller 42 obtains voltage values of the battery cell 12, with respect to ground, from the voltage sensor 36 at a second update frequency of N times per second, wherein M>=N.

At block 704, at a third update frequency of R times per second, where R<M and R<N and where the symbol j is a reference to the current operational cycle associated with the third update frequency and j−1 refers to the previous operational cycle associated with the third update frequency, the following subblocks are performed.

At subblock 706, the microcontroller 42 determines the rate of change of cell current (di/dt) utilizing the following equation:

$$di/dt = I_j - I_{j-1}/t_j - t_{j-1}$$

wherein:
di/dt is the calculation of the first derivative of battery cell 12 current with respect to time.
$I_j$ is the value of last sampled current value prior to the execution of the operational cycle associated with the third update frequency.
$I_{j-1}$ is the value of last sampled cell current value prior to the execution of the operational cycle previous to the current operational cycle associated with the third update frequency.
$t_j$ is the elapsed time since system startup that is recorded at the start of execution of the operational cycle associated with the third update frequency.
$t_{j-1}$ is the elapsed time since system startup that is recorded at the start of execution of the operational cycle previous to the current operational cycle associated with the third update frequency.

Figure 9:
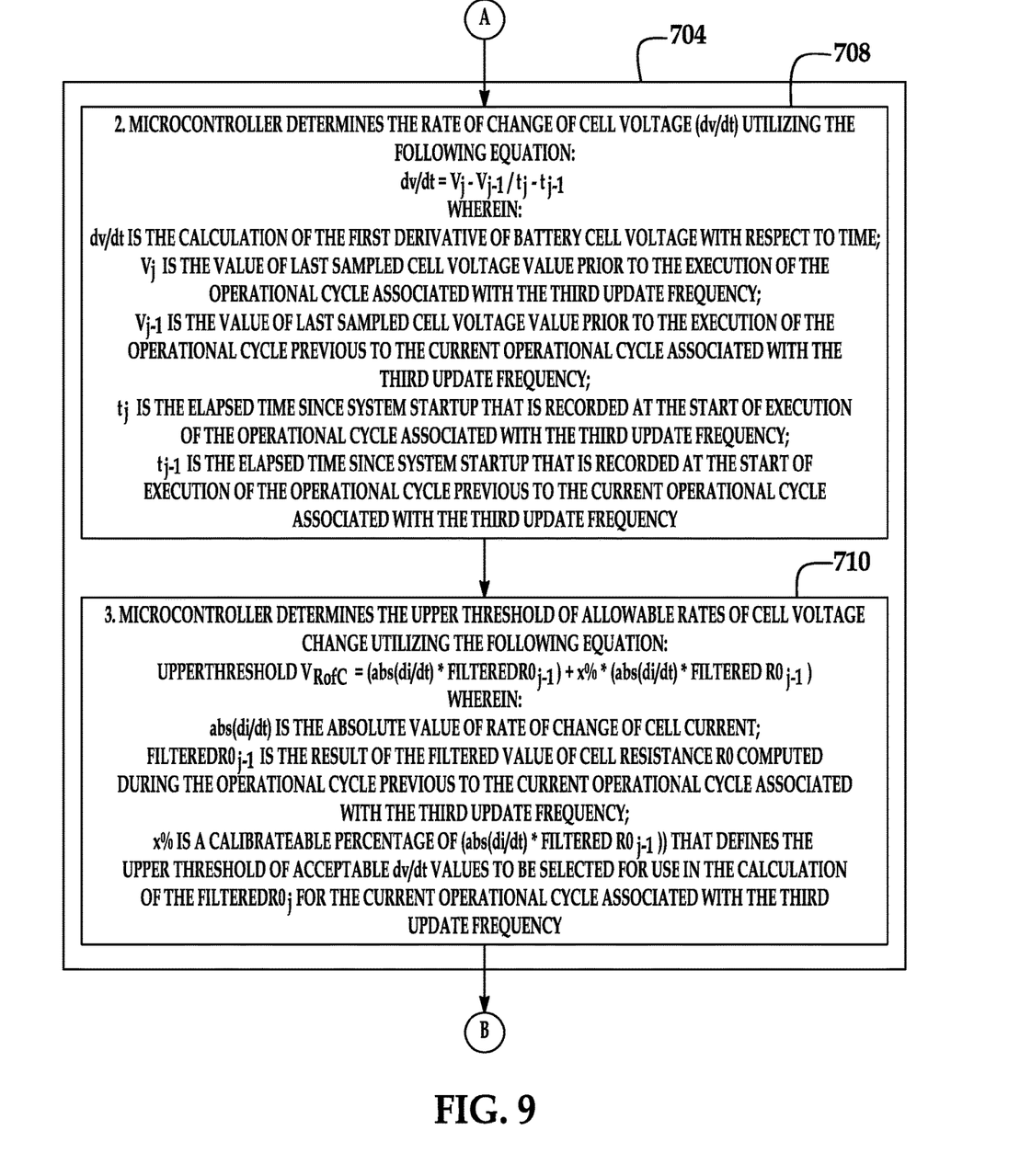

At subblock 708, the microcontroller 42 determines the rate of change of cell voltage (dv/dt) utilizing the following equation:

$$dv/dt = V_j - V_{j-1}/t_j - t_{j-1}$$

wherein:
dv/dt is the calculation of the first derivative of battery cell 12 voltage with respect to time.
$V_j$ is the value of last sampled cell voltage value prior to the execution of the operational cycle associated with the third update frequency.
$V_{j-1}$ is the value of last sampled cell voltage value prior to the execution of the operational cycle previous to the current operational cycle associated with the third update frequency.
$t_j$ is the elapsed time since system startup that is recorded at the start of execution of the operational cycle associated with the third update frequency.
$t_{j-1}$ is the elapsed time since system startup that is recorded at the start of execution of the operational cycle previous to the current operational cycle associated with the third update frequency.

At subblock 710, the microcontroller 42 determines the upper threshold of allowable rates of cell voltage change utilizing the following equation:

$$\text{UpperThreshold}V_{RofC} = (\text{abs}(di/dt)*\text{Filtered}R0_{j-1}) + x\%*(\text{abs}(di/dt)*\text{Filtered}R0_{j-1})$$

wherein:
abs(di/dt) is the absolute value of rate of change of cell current.
$\text{Filtered}R0_{j-1}$ is the result of the filtered value of cell resistance R0 computed during the operational cycle previous to the current operational cycle associated with the third update frequency.
x % is a calibrateable percentage of (abs(di/dt)*FilteredR0$_{j-1}$)) that defines the upper threshold of acceptable dv/dt values to be selected for use in the calculation of the FilteredR0$_j$ for the current operational cycle associated with the third update frequency.

Figure 10:
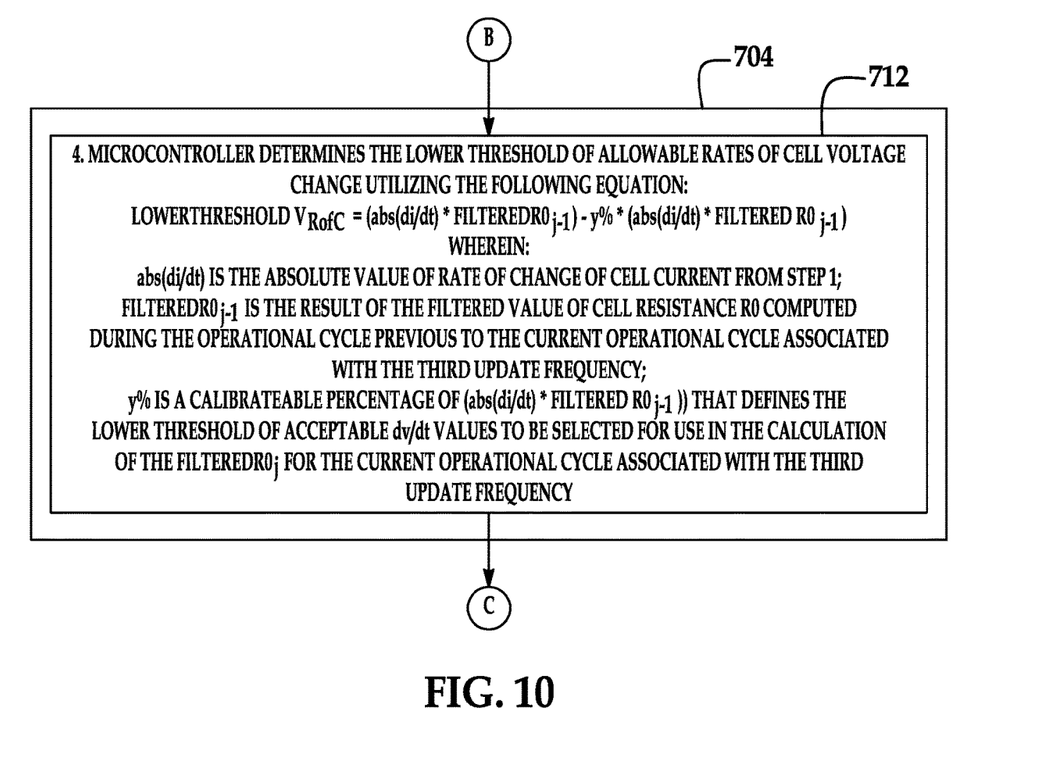

At subblock 712, the microcontroller 42 determines the lower threshold of allowable rates of cell voltage change utilizing the following equation:

$$\text{LowerThreshold}V_{RofC} = (\text{abs}(di/dt)*\text{Filtered}R0_{j-1}) - y\%*(\text{abs}(di/dt)*\text{Filtered}R0_{j-1})$$

wherein:
abs(di/dt) is the absolute value of rate of change of cell current from step 1.
$\text{Filtered}R0_{j-1}$ is the result of the filtered value of cell resistance R0 computed during the operational cycle previous to the current operational cycle associated with the third update frequency.
y % is a calibrateable percentage of (abs(di/dt)*FilteredR0$_{j-1}$)) that defines the lower threshold of acceptable dv/dt values to be selected for use in the calculation of the FilteredR0$_j$ for the current operational cycle associated with the third update frequency.

At subblock 714, the microcontroller 42 makes a determination as to whether the (sign(dv/dt)=sign(di/dt)) AND (LowerThreshold$V_{RofC}$<=dv/dt<=UpperThreshold$V_{RofC}$).

Figure 11:
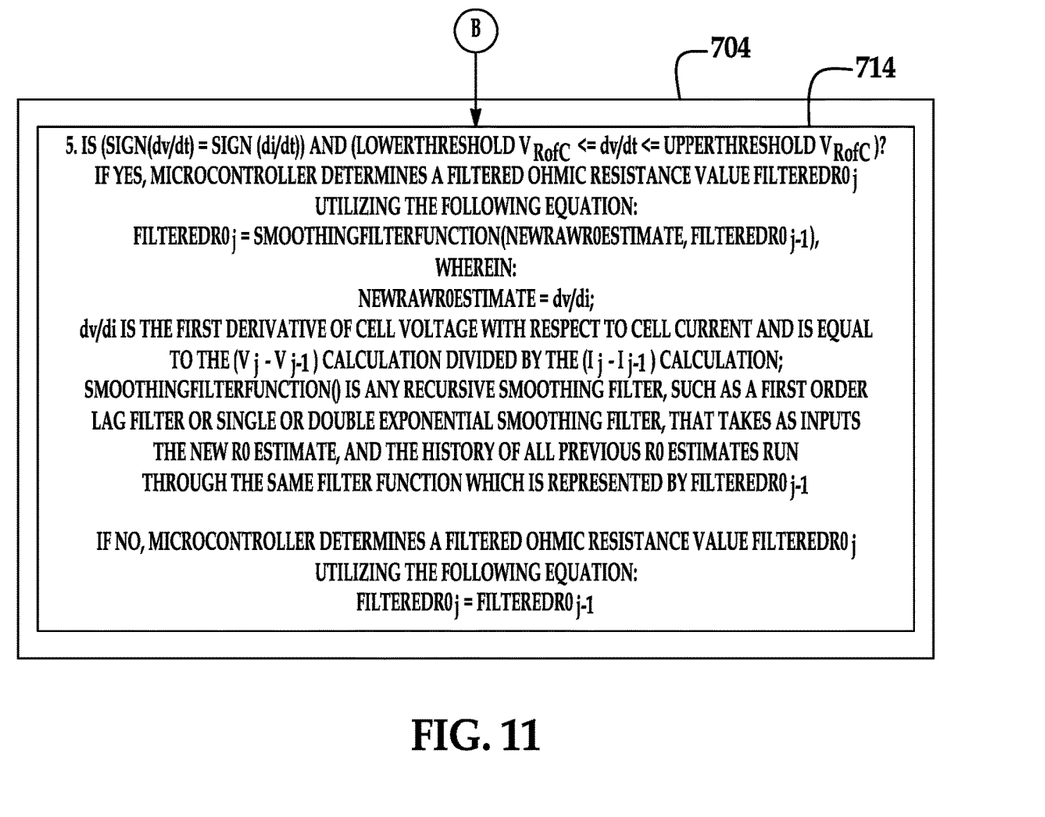

If the value of the above determination of subblock 714 is "yes", the microcontroller 42 determines a filtered ohmic resistance value FilteredR0$_j$ utilizing the following equation:

$$\text{Filtered}R0_j = \text{smoothingFilterFunction}(\text{NewRaw}R0\text{Estimate}, \text{Filtered}R0_{j-1}), \text{ wherein:}$$

$$\text{NewRawR0Estimate} = dv/di$$

dv/di is the first derivative of cell voltage with respect to cell current and is equal to the ($V_j-V_{j1}$) calculation divided by the ($I_j-I_{j-1}$) calculation.
smoothingFilterFunction( ) is any recursive smoothing filter, such as a first order lag filter or single or double exponential smoothing filter, that takes as inputs a minimum the new R0 estimate, and the history of all previous R0 estimates run through the same filter function which is represented by FilteredR0$_{j-1}$.

Alternately, if the value of the above determination of subblock 714 is "no", the microcontroller 42 determines the filtered ohmic resistance value FilteredR0$_j$ utilizing the following equation:

$$\text{Filtered}R0_j = \text{Filtered}R0_{j-1}.$$

The above-described method can be at least partially embodied in the form of one or more memory devices or computer readable media having computer-executable instructions for practicing the methods. The memory devices can comprise one or more of the following: hard drives, RAM memory, flash memory, and other computer-readable media known to those skilled in the art; wherein, when the computer-executable instructions are loaded into and executed by one or more microcontrollers or computers, the one or more microcontrollers or computers become an apparatus programmed to practice the associated steps of the method.

The battery monitoring system described herein provides a substantial advantage over other systems. In particular, the battery monitoring system provides a technical effect of identifying and selecting good candidate current and cell voltage pairs for use in R0 estimate calculations, and filters out current and cell voltage pairs that have identifiable time synchronization and electrical-noise related errors, to obtain a filtered ohmic resistance value of the battery cell.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery monitoring system, comprising:
a current sensor electrically coupled in series with a battery cell;
a voltage sensor electrically coupled in parallel to the battery cell;
a microcontroller obtaining cell current values of a cell current flowing through the battery cell from the current sensor at a first update frequency of M times per second;
the microcontroller obtaining cell voltage values of the battery cell from the voltage sensor, in parallel to the obtaining of the cell current values, with respect to electrical ground, at a second update frequency of N times per second, wherein M>=N;
at a third update frequency of R times per second, where R<M and R<N,
the microcontroller determining a rate of change of cell current utilizing two cell current values of the cell current values;
the microcontroller determining a rate of change of cell voltage utilizing two cell voltage values of the cell voltage values; and the microcontroller determining a filtered ohmic resistance value based on the rate of change of cell voltage, the rate of change of cell current, and a prior filtered ohmic resistance value, if a numerical sign of the rate of change of cell voltage being identical to a numerical sign of the rate of change of cell current, and the rate of change of cell voltage being less than or equal to an upper threshold of allowable rates of cell voltage change, and the rate of change of cell voltage being greater than or equal to a lower threshold of allowable rates of cell voltage change.

2. The battery monitoring system of claim 1, wherein:
the microcontroller determining the filtered ohmic resistance value utilizing a prior filtered ohmic resistance value, if the numerical sign of the rate of change of cell voltage is not identical to the numerical sign of the rate of change of cell current, or the rate of change of cell voltage is not less than or equal to the upper threshold of allowable rates of cell voltage change, or the rate of change of cell voltage is not greater than or equal to the lower threshold of allowable rates of cell voltage change.

3. The battery monitoring system of claim 1, wherein:
a symbol j is a reference to a current operational cycle associated with the third update frequency, and j−1 refers to a previous operational cycle associated with the third update frequency.

4. The battery monitoring system of claim 3, wherein:
the microcontroller determining the rate of change of cell current utilizing a following equation:

$$di/dt = I_j - I_{j-1}/t_j - t_{j-1}$$

wherein:
di/dt is the rate of change of cell current corresponding to a first derivative of cell current with respect to time;
$I_j$ is a value of a last sampled current value prior to an execution of the current operational cycle associated with the third update frequency;
$I_{j-1}$ is a value of a last sampled cell current value prior to an execution of an operational cycle previous to the current operational cycle associated with the third update frequency;
$t_j$ is an elapsed time since system startup that is recorded at a start of execution of the current operational cycle associated with the third update frequency;
$t_{j-1}$ is an elapsed time since the system startup that is recorded at a start of execution of the operational cycle previous to the current operational cycle associated with the third update frequency.

5. The battery monitoring system of claim 3, wherein:
the microcontroller determining the rate of change of cell voltage utilizing a following equation:

$$dv/dt = V_j - V_{j-1}/t_j - t_{j-1}$$

wherein:
dv/dt is the rate of change of cell voltage corresponding to a calculation of a first derivative of cell voltage with respect to time;
$V_j$ is a value of a last sampled cell voltage value prior to an execution of the current operational cycle associated with the third update frequency;
$V_{j-1}$ is a value of a last sampled cell voltage value prior to an execution of the operational cycle previous to the current operational cycle associated with the third update frequency;
$t_j$ is an elapsed time since a system startup that is recorded at a start of execution of the current operational cycle associated with the third update frequency;

$t_{j-1}$ is an elapsed time since the system startup that is recorded at a start of execution of the operational cycle previous to the current operational cycle associated with the third update frequency.

6. The battery monitoring system of claim 3, wherein:

the microcontroller determining the upper threshold of allowable rates of cell voltage change utilizing a following equation:

$$\text{UpperThresholdV}_{RofC} = (\text{abs}(di/dt) * \text{Filtered}R0_{j-1}) + x\% * (\text{abs}(di/dt) * \text{Filtered}R0_{j-1})$$

wherein:

UpperThresholdV$_{RofC}$ is the upper threshold of allowable rates of cell voltage change;

abs(di/dt) is an absolute value of the rate of change of cell current;

FilteredR0$_{j-1}$ is a result of a filtered value of cell resistance R0 computed during the operational cycle previous to the current operational cycle associated with the third update frequency;

x % is a calibrateable percentage of (abs(di/dt)*FilteredR0$_{j-1}$)) that defines an upper threshold of acceptable dv/dt values to be selected for use in a calculation of the FilteredR0$_j$ for the current operational cycle associated with the third update frequency.

7. The battery monitoring system of claim 3, wherein:

the microcontroller determining the lower threshold of allowable rates of cell voltage change utilizing a following equation:

$$\text{LowerThreshold}V_{RofC} = (\text{abs}(di/dt) * \text{Filtered}R0_{j-1}) - y\% * (\text{abs}(di/dt) * \text{Filtered}R0_{j-1})$$

wherein:

LowerThresholdV$_{RofC}$ is the lower threshold of allowable rates of cell voltage change;

abs(di/dt) is an absolute value of the rate of change of cell current;

FilteredR0$_{j-1}$ is a result of a filtered value of cell resistance R0 computed during the operational cycle previous to the current operational cycle associated with the third update frequency;

y % is a calibrateable percentage of (abs(di/dt)*FilteredR0$_{j-1}$)) that defines a lower threshold of acceptable dv/dt values to be selected for use in a calculation of the FilteredR0$_j$ for the current operational cycle associated with the third update frequency.

8. The battery monitoring system of claim 3, wherein:

the microcontroller determining the filtered ohmic resistance value if the numerical sign of the rate of change of cell voltage is identical to the numerical sign of the rate of change of cell current, and the rate of change of cell voltage is less than or equal to the upper threshold of allowable rates of cell voltage change, and the rate of change of cell voltage is greater than or equal to the lower threshold of allowable rates of cell voltage change, utilizing a following equation:

$$\text{Filtered}R0_j = \text{smoothingFilterFunction}(\text{NewRaw}R0\text{Estimate}, \text{Filtered}R0_{j-1}),$$

wherein:

FilteredR0$_j$ is the filtered ohmic resistance value;

$$\text{NewRaw}R0\text{Estimate} = dv/di;$$

dv/di is a first derivative of cell voltage with respect to cell current and is equal to a ($V_j - V_{j-1}$) calculation divided by a ($I_j - I_{j-1}$) calculation; and $V_j$ is a value of a last sampled cell voltage value prior to an execution of the current operational cycle associated with the third update frequency, and $V_{j-1}$ is a value of a last sampled cell voltage value prior to the execution of the operational cycle previous to the current operational cycle associated with the third update frequency; $I_j$ is a value of a last sampled cell current value prior to an execution of the current operational cycle associated with the third update frequency, and $I_{j-1}$ is a value of a last sampled cell current value prior to the execution of the operational cycle previous to the current operational cycle associated with the third update frequency; and smoothingFilterFunction( ) is a recursive smoothing filter.

9. The battery monitoring system of claim 8, wherein:

the recursive smoothing filter is a first order lag filter, or a single exponential smoothing filter, or a double exponential smoothing filter.

* * * * *